(12) United States Patent
Petrova-Koch et al.

(10) Patent No.: US 10,978,994 B2
(45) Date of Patent: Apr. 13, 2021

(54) PHOTOVOLTAIC MODULE AND PHOTOVOLTAIC SYSTEM

(71) Applicant: TUBESOLAR AG, Augsburg (DE)

(72) Inventors: Vesselinka Petrova-Koch, Garching (DE); Reiner Mackh, Zusmarshausen (DE); Annette Goss, Burgau (DE); Johann Mayer, Konigsbrunn (DE); Roland Huttinger, Kaufering (DE); Joerg Leckert, Kissing (DE); Joachim Wirth-Schon, Gunzburg (DE)

(73) Assignee: TUBESOLAR AG, Augsburg (DE)

( * ) Notice: Subject to any disclaimer, the term of this patent is extended or adjusted under 35 U.S.C. 154(b) by 178 days.

(21) Appl. No.: 15/535,370

(22) PCT Filed: Dec. 11, 2015

(86) PCT No.: PCT/EP2015/079475
§ 371 (c)(1),
(2) Date: Jun. 12, 2017

(87) PCT Pub. No.: WO2016/092090
PCT Pub. Date: Jun. 16, 2016

(65) Prior Publication Data
US 2017/0331426 A1 Nov. 16, 2017

(30) Foreign Application Priority Data

Dec. 11, 2014 (DE) ............ 10 2014 225 631.3

(51) Int. Cl.
*H01L 31/00* (2006.01)
*H02S 40/42* (2014.01)
(Continued)

(52) U.S. Cl.
CPC ........ *H02S 40/425* (2014.12); *H01L 31/0322* (2013.01); *H01L 31/03926* (2013.01);
(Continued)

(58) Field of Classification Search
CPC ........ H02S 40/425; H02S 40/38; H02S 30/10; H02S 20/00; H01L 31/0322;
(Continued)

(56) References Cited

U.S. PATENT DOCUMENTS

| 7,196,262 B2 | 3/2007 | Gronet |
| 7,235,736 B1 | 6/2007 | Buller et al. |

(Continued)

FOREIGN PATENT DOCUMENTS

WO 03017376 A1 2/2003

*Primary Examiner* — Angelo Trivisonno
(74) *Attorney, Agent, or Firm* — Hayes Soloway PC

(57) ABSTRACT

A photovoltaic module is specified, comprising: a cylindrical light-transmissive tube enclosing an interior and having a main extension direction and a curved inner surface facing the interior, and a mechanically flexible photovoltaic component comprising a solar cell arrangement applied on a carrier film, wherein the photovoltaic component is arranged in the interior, the solar cell arrangement has a curvature, wherein the curvature follows the curved course of the inner surface of the tube at least in places and the solar cell arrangement at least partly covers the inner surface, wherein the covered inner surface forms a light passage surface of the photovoltaic module.

20 Claims, 4 Drawing Sheets

(51) Int. Cl.
*H01L 31/0392* (2006.01)
*H02S 20/00* (2014.01)
*H01L 31/053* (2014.01)
*H02S 30/10* (2014.01)
*H02S 40/38* (2014.01)
*H01L 31/032* (2006.01)
*H01L 31/048* (2014.01)
*H01L 51/00* (2006.01)
*H01L 51/44* (2006.01)

(52) U.S. Cl.
CPC .... *H01L 31/03928* (2013.01); *H01L 31/0481* (2013.01); *H01L 31/053* (2014.12); *H01L 51/0097* (2013.01); *H01L 51/448* (2013.01); *H02S 20/00* (2013.01); *H02S 30/10* (2014.12); *H02S 40/38* (2014.12); *Y02B 10/10* (2013.01); *Y02E 10/50* (2013.01)

(58) Field of Classification Search
CPC ........... H01L 31/0481; H01L 31/03928; H01L 31/053; H01L 31/03926; H01L 51/448; H01L 51/0097; Y02B 10/12; Y02E 10/50; Y02E 10/541
USPC .................................................. 136/243–265
See application file for complete search history.

(56) References Cited

U.S. PATENT DOCUMENTS

| | | | |
|---|---|---|---|
| 7,394,016 B2 | 7/2008 | Gronet | |
| 2005/0040374 A1 | 2/2005 | Chittibabu et al. | |
| 2005/0098202 A1* | 5/2005 | Maltby, Jr. .......... | H01L 31/0296 136/256 |
| 2006/0086384 A1* | 4/2006 | Nakata ................ | H01L 25/0753 136/250 |
| 2006/0185714 A1 | 8/2006 | Nam et al. | |
| 2007/0079864 A1* | 4/2007 | Gronet ............. | H01L 31/02008 136/244 |
| 2007/0227579 A1 | 10/2007 | Buller et al. | |
| 2008/0110491 A1* | 5/2008 | Buller ............. | H01L 31/035281 136/249 |
| 2008/0264472 A1 | 10/2008 | Cumpston et al. | |
| 2010/0154857 A1* | 6/2010 | Tell .................... | H01L 31/0392 136/244 |
| 2011/0100437 A1* | 5/2011 | Takahashi ......... | H01L 31/02008 136/251 |
| 2012/0168910 A1* | 7/2012 | Jackrel .................. | H01L 21/268 257/613 |
| 2012/0279561 A1* | 11/2012 | Kalyanaraman ...... | H01L 31/042 136/255 |
| 2013/0056065 A1* | 3/2013 | Yin ........................ | B32B 37/15 136/256 |
| 2013/0167910 A1* | 7/2013 | DeGroot ............. | H01L 31/0504 136/251 |

* cited by examiner

PHOTOVOLTAIC MODULE AND PHOTOVOLTAIC SYSTEM

Publications U.S. Pat. No. 7,196,262 B2 and U.S. Pat. No. 7,394,016 B2 each describe a photovoltaic module and a photovoltaic system.

One object to be achieved is to indicate a photovoltaic module with increased efficiency. Another object to be achieved is to indicate a photovoltaic system with increased efficiency and reduced maintenance cost.

A photovoltaic module is indicated. The photovoltaic module is provided in particular for direct conversion of the energy contained in sunlight into electrical energy.

According to at least one embodiment of the photovoltaic module, this comprises at least one tube. The tube has a main extension direction and a curved inner face facing an interior of the tube. The tube may furthermore comprise a curved outer face facing away from the inner face. The tube is for example cylindrical, in particular circular cylindrical, and surrounds the interior. The tube is thus configured, at least in places, in the manner of a hollow cylinder or a hollow circular cylinder. The outer face of the tube may form an outer face of the photovoltaic module. The photovoltaic module may then have the cylindrical structure of the tube.

The tube preferably has, at least in places, the form of a hollow circular cylinder. The main extension direction then corresponds to the height of the hollow cylinder. In a cross-section perpendicular to the main extension direction, the tube then has the form of a circular ring. The inner circle of the circular ring here forms the inner face of the tube.

Here and below, terms such as "cylindrical" and/or "hollow cylinder" should not be understood in the strictly geometrical sense. Rather, a cylindrical tube or a tube in the form of a hollow cylinder may also have a cross-section perpendicular to the main extension direction which is only approximately circular. For example, perpendicular to the main extension direction, the tube has an elliptical cross-section, wherein the numerical eccentricity of the ellipse is maximum 0.8.

The tube is configured translucent. The term "translucent" here and below means that at least 90%, preferably at least 94%, of the light hitting the translucent material is transmitted through the material. For example, the tube is formed from glass or plastic, or consists of a glass or a plastic. For example, the tube is formed with soda-lime silicate glass or consists of soda-lime silicate glass. Soda-lime silicate glass is distinguished in particular by its low price.

The breaking strength of the glass used may be increased by rapid cooling and/or other special in-line processes. This allows in particular use of the tube under adverse environmental conditions. To improve the transmission properties of the material of the tube, the outer face of the tube may also be de-reflected. For example, an antireflection coating is applied to the outer face of the tube.

According to at least one embodiment of the photovoltaic module, this furthermore comprises a mechanically flexible photovoltaic component. The photovoltaic component comprises a solar cell arrangement applied to a carrier film. A solar cell arrangement may here and below consist of one or more solar cells, in particular connected in series. The solar cell arrangement comprises at least one active layer in which free charge carriers can be produced under incident sunlight.

The photovoltaic component is formed mechanically flexibly. In particular, the solar cell arrangement and the carrier film are formed mechanically flexibly. The term "mechanically flexible" here and below means that non-destructive bending, rolling and/or curving of the photovoltaic module may take place. In particular, the photovoltaic component may be rolled up and/or bent—even repeatedly—without changing its electrical and/or optical properties.

According to at least one embodiment of the photovoltaic module, the photovoltaic component is arranged in the interior of the tube. The photovoltaic component may in particular be arranged completely in the interior. The photovoltaic component is then surrounded completely by the material of the tube, at least perpendicular to the main extension direction. Preferably, the photovoltaic component directly adjoins the tube. Alternatively, air or another gas may be arranged between the photovoltaic component and the tube.

According to at least one embodiment of the photovoltaic module, the solar cell arrangement has a curvature. The curvature of the solar cell arrangement, at least in places, follows the curved course of the inner face of the tube. In other words, in a cross-section perpendicular to the main extension direction, the solar cell arrangement and the inner face have curvatures which are similar in the mathematical sense. For example, in a cross-section perpendicular to the main extension direction, the inner face of the tube has the form of an ellipse or a circle.

In this case, the solar cell arrangement has the form of an ellipse or a circle, at least in places. It is furthermore possible that the entire photovoltaic component follows the curved course of the inner face.

According to at least one embodiment of the photovoltaic module, the solar cell arrangement covers the inner face at least partially. In other words, in a view onto the tube from the interior, in a direction perpendicular to the main extension direction, the inner face is at least partially covered by the solar cell arrangement. The covered inner face of the tube then forms a light-passage face of the photovoltaic module.

According to at least one embodiment of the photovoltaic module, this comprises a cylindrical translucent tube surrounding an interior, with a main extension direction and a curved inner face facing the interior, and a mechanically flexible photovoltaic component with a solar cell arrangement applied to a carrier film. The photovoltaic component is arranged in the interior. The solar cell arrangement has a curvature, wherein the curvature at least in places follows the curved course of the inner face of the tube. The solar cell arrangement covers the inner face at least partially, wherein the covered inner face forms a light-passage face of the photovoltaic module.

The combination of a flexible photovoltaic component with a translucent tube in particular allows the use of an economic production process in conjunction with high efficiency. The efficiency of the photovoltaic module here and below means the electrical energy generated per area covered. The curved structure, for example cylindrical, of the photovoltaic module, in comparison with conventional flat photovoltaic module, brings several advantages in terms of the efficiency and service life of the photovoltaic module. For example, the cross-section area of the photovoltaic module is reduced, whereby a greater weather resistance of the photovoltaic module can be achieved, for example under load from wind and/or snow. Furthermore, the curved outer face gives a self-cleaning effect. Due to the cylindrical structure, also the weight of the photovoltaic module is reduced in comparison with flat photovoltaic modules, whereby use is possible on buildings with roofs with low static load capacity.

Furthermore, the natural air circulation inside the tube lowers the operating temperature of the photovoltaic module. For this, the tube may for example be open at the ends, at least in places. In general, due to the curved e.g. cylindrical structure, water-cooling or passive cooling of the photovoltaic modules can be implemented more easily than in flat photovoltaic modules. Low operating temperatures guarantee a high energy yield and improved functional reliability. Due to the curved design of the photovoltaic component, also sunlight with a low angle of incidence, e.g. when the sun is low in the sky, can be utilized. In this way, there is no need in the photovoltaic module for a so-called tracking device to guide the module according to the position of the sun, and hence no complex mechanics and/or electronics. With the photovoltaic module described here, passive cooling is possible even in use in desert regions. This increases the efficiency of the photovoltaic module and at the same time reduces the maintenance cost.

Due to the increase in breaking strength of the tube, the outer face of the tube is also more resistant to surface damage, and or more resistant to scratches e.g. from sand grains. Thus the optical properties of the tube can be retained even over long usage periods in sometimes adverse environmental conditions.

According to at least one embodiment of the photovoltaic module, the photovoltaic component comprises at least one encapsulation film. The at least one encapsulation film covers the solar cell arrangement of the photovoltaic component on at least one outer face. For example, the at least one encapsulation film completely covers a base surface of the photovoltaic component facing away from the inner face of the tube. In this way, the encapsulation film may, at least in places, be in direct contact with the base surface. The at least one encapsulation film is preferably formed so as to be translucent. Furthermore, the at least one encapsulation film may also be configured so as to be mechanically flexible.

According to at least one embodiment of the photovoltaic module, the photovoltaic component comprises at least two encapsulation films joined together by substance bonding. The solar cell arrangement is completely arranged between the at least two encapsulation films. Preferably, the solar cell arrangement in places directly adjoins the encapsulation films. Each encapsulation film is preferably configured so as to be mechanically flexible. The term "substance bonding" here and below refers to a joint in which the joint partners are held together partially by atomic and/or molecular forces. Examples of a connection by substance bonding are a glue joint and/or a melt joint. A connection by substance bonding in particular cannot be separated without destruction. In other words, the joint partners can only be separated using a solvent or by destruction.

For example, the photovoltaic component may comprise up to three encapsulation films, wherein the solar cell arrangement is arranged between at least two of the encapsulation films. In particular, all encapsulation films of the photovoltaic component may be joined together by substance bonding.

The encapsulation films may in particular serve for mechanical and/or chemical protection of the solar cell arrangement from environmental influences. For example, the encapsulation films may protect the solar cell arrangement from moisture. The encapsulation films may in particular be configured so as to be UV-resistant. This means that the encapsulation films do not change or scarcely change their optical and/or mechanical properties under UV radiation even over long periods.

According to at least one embodiment of the photovoltaic module, in a cross-section perpendicular to the main extension direction, the solar cell arrangement has an arcuate form, at least in places, within the limits of production tolerances. "Within the limits of production tolerances" here and below means that the solar cell arrangement need not to have an arcuate form in the strict mathematical-geometric sense, but deviations may be present which may be caused by production. For example, the solar cell arrangement may have the form of an ellipse arc, wherein the associated ellipse may have a numerical eccentricity of up to 0.8. Furthermore, the curvature of the photovoltaic component may not be uniform.

According to at least one embodiment of the photovoltaic module, at least one of the encapsulation films is a thermoplastic film. Preferably, all encapsulation films are thermoplastic films. The thermoplastic films may be formed from a plastic. For example, a silicon-based plastic may be a suitable material for the encapsulation film. A thermoplastic film changes its mechanical properties under the supply of heat. For example, the thermoplastic film may be laminated onto the solar cell arrangement. Furthermore, the substance-bonding connection of the encapsulation films may be produced by laminating. Additionally or alternatively, it is possible that at least one encapsulation film is formed with a copolymer such as for example ethylene-vinyl-acetate.

The use of a thermoplastic film brings the particular advantage that even under unfavorable environmental conditions, it is electrically highly insulating, non-corrosive and highly flexible. The mechanical flexibility is also guaranteed both at low and high temperatures. Furthermore, the use of a thermoplastic film allows recycling of the photovoltaic module at the end of its service life. Thus a photovoltaic module may be provided which is environmentally friendly and can be disposed of cheaply.

According to at least one embodiment of the photovoltaic module, at least 30% and most 100% of the inner face of the tube is covered by the solar cell arrangement. Preferably, at least 40% and at most 70% of the inner face of the tube is covered by the solar cell arrangement. It is furthermore possible that the at least one encapsulation film covers at least 20%, preferably at least 30% and at most 100%, preferably at most 80% of the inner face of the tube. For example, only a part of the inner face of the tube facing the sun is provided with the solar cell arrangement, in order to save costs. Thus it is possible that the at least one encapsulation film also does not cover the entire inner face but is arranged only on the inner face covered by the solar cell arrangement. It is furthermore possible that at least 30% and up to 100% of the inner face of the tube forms the light-passage face. For example, one half of the casing of the cylindrical tube is covered by the solar cell arrangement while the other half of the casing is free from the solar cell arrangement. The tube casing may be the outer face of the tube. Here it is possible that, after installation of the photovoltaic module, the covered half of the cylinder faces the sun, i.e. forms a top side of the photovoltaic module.

According to at least one embodiment of the photovoltaic module, the light-passage face is a single cohesive surface. In other words, the solar cell arrangement covers a cohesive area which has no cutouts. For example, the light-passage face in flat state has the form of a, in particular rounded, rectangle.

According to at least one embodiment of the photovoltaic module, the photovoltaic component is completely surrounded by the tube perpendicular to the main extension direction. Here it is possible that the tube is open at its ends in the main extension direction, and/or that the interior is freely accessible at the ends. Perpendicular to the main extension direction, the tube is formed so as to be continuous and integral, and surrounds the photovoltaic component completely. In this way, the photovoltaic component may be protected from environmental influences.

According to at least one embodiment of the photovoltaic module, the solar cell arrangement is applied to the carrier film using a printing process. For example, the solar cell arrangement may be applied to the carrier film with inkjet printing. The carrier film may be a thin steel film or a thin plastic film. The carrier film is in particular configured so as to be mechanically flexible.

For example, the solar cell arrangement may be applied to the carrier film in a roll-to-roll process. In such a process, firstly the carrier film is provided wound into the form of a roll. Then the carrier film is unwound from the roll and the solar cell arrangement is printed onto the carrier film. After the printing process, the carrier film including the solar cell arrangement applied to the carrier film is rolled up again. Such a roll-to-roll process in particular allows rapid and economic production of the solar cell arrangement. However, other production processes with which a mechanically flexible solar cell arrangement can be produced are also conceivable.

According to at least one embodiment of the photovoltaic module, the solar cell arrangement is a CIGS solar cell arrangement or an organic solar cell arrangement. A CIGS (copper indium gallium selenide) solar cell arrangement contains the materials copper, indium, gallium and diselenide. An organic solar cell arrangement is formed with organic layers. Such solar cell arrangements have the advantage that they can be applied to the carrier film in a printing process, in particular an economic printing process. The solar cell arrangement may furthermore contain, as well as the above-mentioned materials, further layers such as for example an electrically conductive layer which may e.g. be formed with a transparent conductive oxide. Furthermore, the solar cell arrangement may contain additional layers for contacting and/or for electrical isolation.

According to at least one embodiment of the photovoltaic module, the solar cell arrangement has a thickness of maximum 5 µm, preferably maximum 2.5 µm. Here, the thickness of the solar cell arrangement is the extension of the solar cell arrangement perpendicular to the main extension plane of the carrier film. The carrier film and/or the solar cell arrangement each have a substantially greater extension along the main extension plane of the carrier film than perpendicular to the main extension plane. The solar cell arrangement is thus a thin layer solar cell. Such a thin layer solar cell may in particular be formed so as to be mechanically flexible and may be applied to a carrier film with a printing process.

According to at least one embodiment of the photovoltaic module, the photovoltaic component furthermore comprises a light-emitting component. The component is configured so as to be mechanically flexible. The light-emitting component may for example be a mechanically flexible, organic light-emitting diode. Furthermore, the light-emitting component may comprise a plurality of inorganic or organic light-emitting diodes arranged on a mechanically flexible carrier.

The light-emitting component covers, at least in places, the free areas of the inner face which are not covered by the solar cell arrangement. For example, half the casing of the cylindrical tube is covered by the solar cell arrangement. The second half of the casing may then be covered by the light-emitting component. This structure arises in particular from the concept that part of the photovoltaic module may be used to generate electrical energy from sunlight while the other part of the photovoltaic module may be used to generate light. A corresponding module is therefore a hybrid module.

The light-emitting component is electrically isolated from the solar cell arrangement. Furthermore, the curvature of the light-emitting component substantially follows the curved course of the inner face of the tube. For example, the light-emitting component is configured bent and, in a cross-section perpendicular to the main extension direction, has an arcuate form within the limits of production tolerances. The free areas of the inner face covered by the component may then form a light-emergence face for the light generated by the light-emitting component.

According to at least one embodiment of the photovoltaic module, this comprises a mechanically flexible light-emitting component, wherein the light-emitting component covers, at least in places, the free areas of the inner face not covered by the solar cell arrangement, the light-emitting component is electrically isolated from the solar cell arrangement, and the curvature of the light-emitting component substantially follows the curved course of the inner face.

According to at least one embodiment of the photovoltaic module, an accumulator is arranged in the interior on the base surface of the photovoltaic component facing away from the inner face. For example, the accumulator is completely surrounded by the photovoltaic component and/or by the tube. The accumulator is here connected electrically conductively to the photovoltaic component. The accumulator may for example be a lithium ion accumulator.

According to at least one embodiment of the photovoltaic module, the accumulator is configured to store electrical energy generated by the solar cell arrangement. For example, for this, the accumulator is connected electrically conductively to the solar cell arrangement. Furthermore, the accumulator is configured to emit the stored electrical energy to the light-emitting component after a time delay. For this, the accumulator may also be connected electrically conductively to the light-emitting component. For example, the electrical energy generated by the solar cell arrangement under solar irradiation during the day can be stored and then emitted again at night to the light-emitting component to produce light.

According to at least one embodiment of the photovoltaic module, a cylindrical metal tube is arranged in the interior on the base surface of the photovoltaic component. The metal tube is preferably formed with a metal or consists of a metal. For example, the metal tube may contain copper or consist of copper. In particular, the metal tube has the form of a hollow cylinder. The metal tube preferably extends completely in the main extension direction of the tube.

According to at least one embodiment of the photovoltaic module the metal tube, at least in places, stands in direct contact with the photovoltaic component. In particular, the metal tube is connected thermally conductively to the photovoltaic component. The metal tube surrounds a cooling chamber filled with air or water. The metal tube may therefore be a cooling tube which dissipates to the environment the waste heat generated by the photovoltaic component. This cooling takes place for example by air circulation or water circulation inside the metal tube. For this, natural convection can be utilized and/or a pump or fan may be used.

Furthermore, a photovoltaic system is indicated. The photovoltaic system is preferably intended for installation in the open, for example on a roof of a house or on agricultural land. The photovoltaic system comprises a plurality of the photovoltaic modules described here. This means that all features disclosed for the photovoltaic module are also disclosed for the photovoltaic system and vice versa.

According to at least one embodiment of the photovoltaic system, this comprises a plurality of photovoltaic modules. Preferably, the photovoltaic modules are not in direct physical contact with each other. In other words, a continuous space is arranged between the respective photovoltaic modules. The extension of the space, i.e. the distance between the photovoltaic modules, may here be selected depending on the desired area of application. The photovoltaic modules may be connected together electrically. The photovoltaic modules may here be connected in series and/or in parallel.

According to at least one embodiment of the photovoltaic system, this furthermore comprises a plurality of holders and at least two fixing tubes. The holders may be mechanical components which are provided for fixing the photovoltaic modules to the two fixing tubes. The fixing tubes may have fixing elements which for example serve for fixing the holders to the fixing tubes.

According to at least one embodiment of the photovoltaic system, each photovoltaic module is mechanically connected to at least one holder. For example, the mechanical connection takes place by means of a plug connection, a screw connection, a glue connection and or a clamp connection.

According to at least one embodiment of the photovoltaic system, each holder is mechanically semi-releasably connected to at least one fixing tube. The term "mechanically semi-releasably connected" here and below means that the fixing to the holders on the fixing tube can be released without destruction. In particular, the fixing tube is not destroyed when the connection is released. For example, the holder is fixed to the fixing tube using a plug connection, a screw connection and/or a clamp connection. The mechanically semi-releasable fixing allows simple and low-cost exchange of individual photovoltaic modules of the photovoltaic system. In this way, if one photovoltaic module is faulty, there is no need to replace the entire photovoltaic system.

According to at least one embodiment of the photovoltaic system, this comprises a plurality of photovoltaic modules, a plurality of holders and at least two fixing tubes, wherein each photovoltaic module is mechanically connected to at least one holder, and each holder is mechanically semi-releasably connected to at least one fixing tube.

The structure of the photovoltaic system arises in particular from the idea of providing a low-maintenance system for generating electrical power. The use of cylindrical photovoltaic modules with an outer face which is larger than in flat modules in particular allows better utilization of the area to be occupied. The area to be occupied may for example be a roof or agricultural land.

Due to the presence of spaces between the photovoltaic modules and the resulting shadow-free configuration, in particular it is possible to use the photovoltaic system in connection with agricultural land. In this way, the agricultural land below the photovoltaic systems may still be used since in particular rainwater and/or sunlight can penetrate through the spaces. Thus for example rainwater may still serve for irrigation. The respective spatial extension of the photovoltaic modules and the distance between the photovoltaic modules may here be selected depending on the area of application.

Furthermore, due to the mechanically semi-releasable fixing of the holder to the fixing tube, it is possible to substantially reduce the maintenance cost of the photovoltaic system. Thus individual photovoltaic modules can be replaced without the need to change the entire system. The individual photovoltaic modules in the photovoltaic system can thus simply be exchanged in a "plug and play" process.

According to at least one embodiment of the photovoltaic system, the main extension directions of the plurality of photovoltaic modules run parallel to each other within the limits of production tolerances. In other words, the photovoltaic system comprises a plurality of cylindrical photovoltaic modules which are arranged parallel with each other. Spaces may then be arranged between the photovoltaic modules.

The photovoltaic module described here and the photovoltaic system described here are explained in more detail below with reference to exemplary embodiments and the associated figures.

Figure 1:
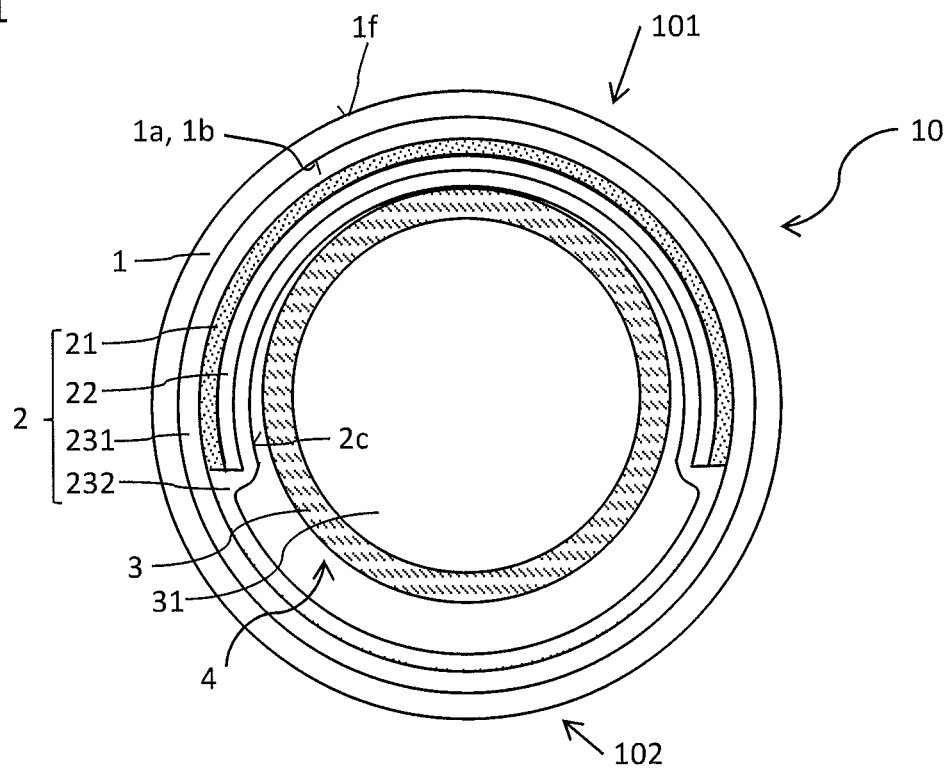
FIG. 1 shows an exemplary embodiment of the photovoltaic module described here in a diagrammatic sectional view.

The same or similar elements or those with equivalent function carry the same reference numerals in the figures. The figures and the size ratios of the elements depicted in the figures should not be regarded as being to scale with each other. Rather, individual elements may be shown excessively large for better clarity and/or better understanding.

An exemplary embodiment of a photovoltaic module 10 described here is explained in more detail with reference to the diagrammatic sectional view in FIG. 1. The cross-section depicted here runs perpendicular to a main extension direction Z of the photovoltaic module 10. The main extension direction Z thus runs into the drawing plane.

The photovoltaic module 10 comprises a translucent tube 1, the cross-section of which in the present case has the form of a circular ring. The tube 1 surrounds a circular interior 4 and has an inner face 1a facing the interior 4 and an outer face if facing away from the inner face 1a. Part of the inner face 1a forms a light-passage face 1b. Here and below, geometric designations such as "circular" should be understood within the limits of production tolerances. For example, the interior 4 may also have an elliptical form.

The photovoltaic module 10 furthermore has a photovoltaic component 2. The photovoltaic component 2 in the present case comprises at least two encapsulation films 231, 232, joined together by substance bonding. The encapsulation films 231, 232 are in direct contact with each other at least in places, and at these places are connected together preferably by substance bonding.

The photovoltaic component 2 furthermore comprises a solar cell arrangement 21 and a carrier film 22 on which the solar cell arrangement 21 is applied. The solar cell arrangement 21 may for example be a CIGS solar cell arrangement or an organic solar cell arrangement. The carrier film 22 may for example be formed with a metal or a plastic. The solar cell arrangement 21 and the carrier film 22 are arranged completely between the at least two encapsulation films 231, 232. In the region in which no solar cell arrangement 21 is present, the two encapsulation films 231, 232 adjoin each other directly.

In the exemplary embodiment depicted in FIG. 1, the two encapsulation films 231, 232 cover the inner face 1a completely. Alternatively, in contrast to the depiction in FIG. 1, it is possible for the inner face 1a to be free from encapsulation films 231, 232 in places. For example, the encapsulation films 231, 232 then only cover the solar cell arrangement 21 and edge areas around the solar cell arrangement 21 which are necessary for the substance-bonded connection of the encapsulation films 231, 232.

The photovoltaic component 2 is arranged in the interior 4. The solar cell arrangement 21 of the photovoltaic component 2 here has a curvature. In the present case, the solar cell arrangement 21 has an arcuate form and the curvature of the associated circle. The curvature of the arc of the solar cell arrangement 21 here follows the curvature of the inner face 1a of the tube. The carrier film 22 and the encapsulation films 231, 232 also have a curvature which, at least in places, follows the curvature of the inner face 1a.

In the area in which the solar cell arrangement 21 covers the inner face 1a of the tube 1, the inner face 1a forms the light-passage face 1b. The part of the photovoltaic module 10 comprising the light-passage face 1b forms a top side 101 of the photovoltaic module 10, while the part without the light-passage face forms the underside 102.

Furthermore, a metal tube 3 surrounding a cooling chamber 31 is arranged in the interior 4. A base surface 2c of the photovoltaic component 2 facing away from the inner face 1a here points in the direction of the metal tube 3. The metal tube 3 is here in direct contact with the photovoltaic component 2. For this, the metal tube 3 in the present case is arranged eccentrically. In other words, the metal tube 3 is not arranged centered relative to the tube 1. The metal tube 3 is completely surrounded by the photovoltaic component 2 and the tube 1. For example, the metal tube 3 serves for cooling the photovoltaic component 2. For this, the cooling chamber 31 may be filled with water and/or air.

Figure 2:
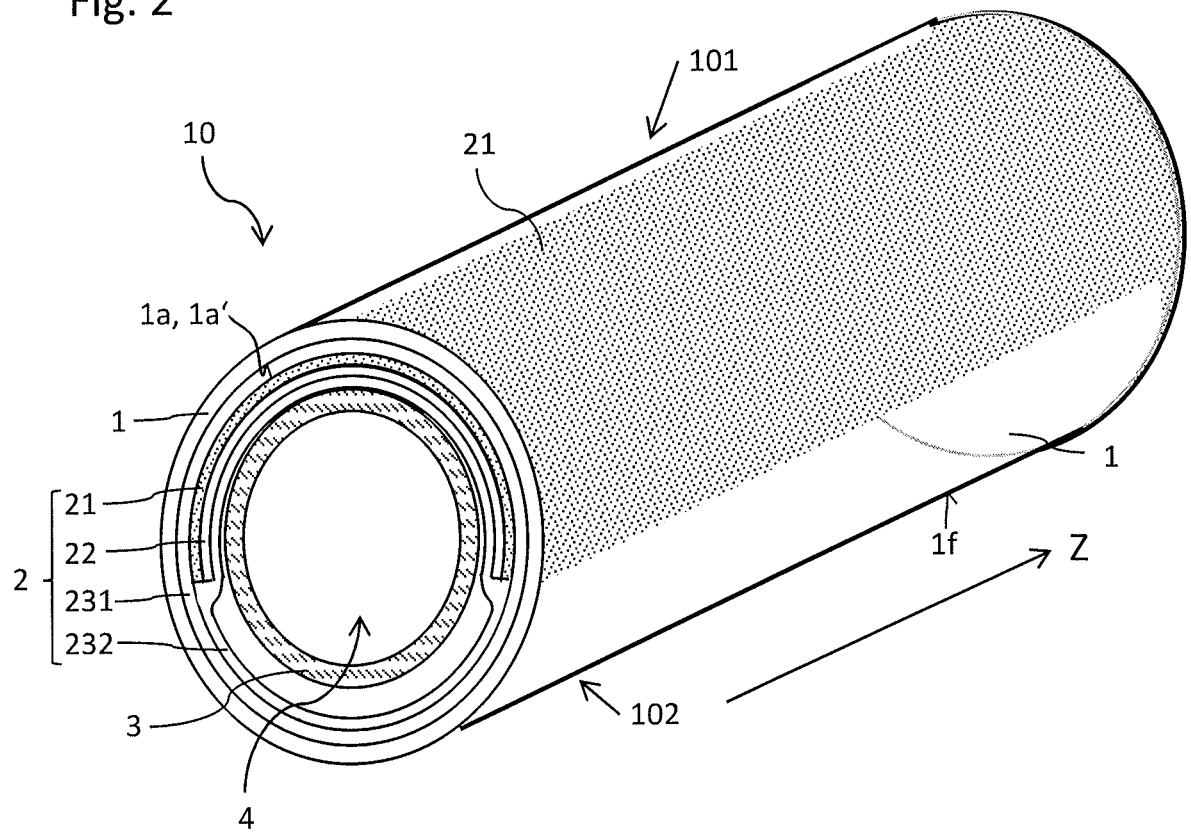
FIG. 2 shows an exemplary embodiment of a photovoltaic module described here in a diagrammatic perspective view.

A further exemplary embodiment of a photovoltaic module 10 described here is explained in more detail with reference to the diagrammatic perspective view of FIG. 2. The photovoltaic module 10 shown here corresponds to the photovoltaic module 10 of FIG. 1.

The tube 1 is formed linear and extends in the main extension direction Z. Perpendicular to the main extension direction Z, the tube 1 has the cross-section shown in FIG. 1. The solar cell arrangement 21 of the photovoltaic module 2 also extends in the main extension direction Z. In a view onto the top side 101, the solar cell arrangement 21 here forms a continuous surface. The light-passage face 1b is then formed as a single cohesive surface. For example, in a view onto the top side 101, the solar cell arrangement 21 has the form of a rounded rectangle.

Figure 3:
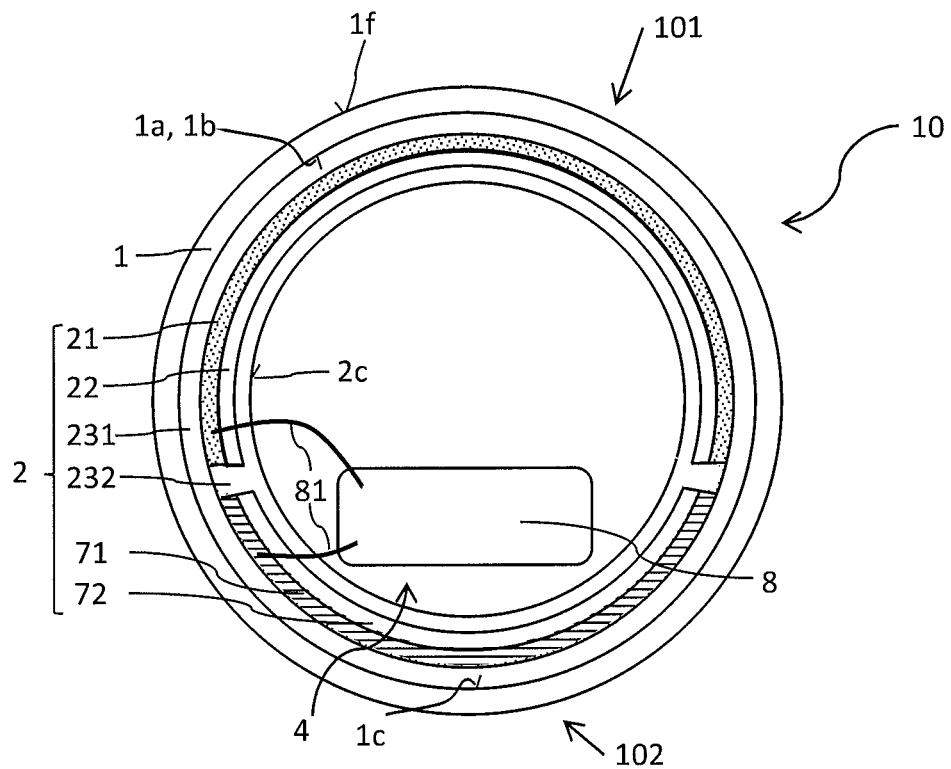
FIG. 3 shows an exemplary embodiment of the photovoltaic module described here in a diagrammatic sectional view.

A further exemplary embodiment of a photovoltaic module 10 described here is explained in more detail with reference to the diagrammatic sectional view of FIG. 3. The photovoltaic module 10 shown here differs from that in FIG. 1 by the presence of a light-emitting component 71, 72 and an accumulator 8.

The light-emitting component 71, 72 covers, at least in places, the free areas 1c of the inner face 1a which are not covered by the solar cell arrangement 21. For example, the solar cell arrangement 21—as depicted here—is arranged on the top side 101 of the photovoltaic module 10, while the light-emitting component 71, 72 is arranged on the underside 102. The light-emitting component 71, 72 here comprises light-emitting layers 71 and a carrier layer 72. For example, the light-emitting layers 71 are formed with organic layers. It is furthermore possible that the light-emitting layers 71 contain inorganic layers. Here it is possible that the light-emitting layer 71 is not formed continuously but rather is divided into individual segments, in order to guarantee a flexibility of the light-emitting components 71, 72.

Furthermore, the accumulator 8 is arranged in the interior 4 of the tube 1. The accumulator 8 is connected electrically conductively to the photovoltaic component 2. For example, electrical connections 81 to the solar cell arrangement 21 and to the light-emitting components 71, 72 are provided.

Figure 4:
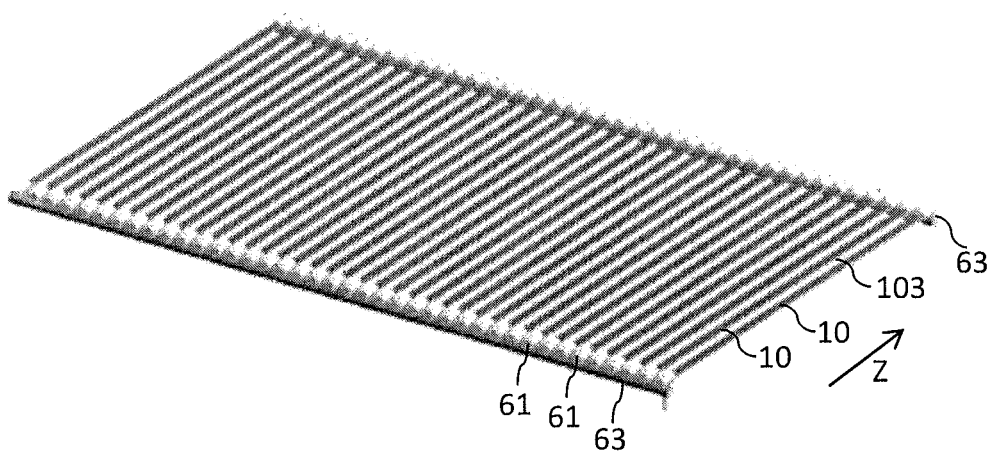
FIGS. 4, 5, 6 and 7 show exemplary embodiments of a photovoltaic system described here in diagrammatic depictions.

An exemplary embodiment of a photovoltaic system described here is explained in more detail with reference to the diagrammatic depiction of FIG. 4. The photovoltaic system comprises a plurality of photovoltaic modules 10. The main extension directions Z of the photovoltaic modules 10 run parallel to each other within the limits of production tolerances. A space 103 is arranged between the photovoltaic modules 10. This space 103 allows the passage of rainwater for example during operation in the open. The photovoltaic modules 10 are attached to two fixing tubes 63 by means of holders 61. The fixing tubes 63 in this case run vertically to the main extension directions Z of the photovoltaic modules 10.

Figure 5:
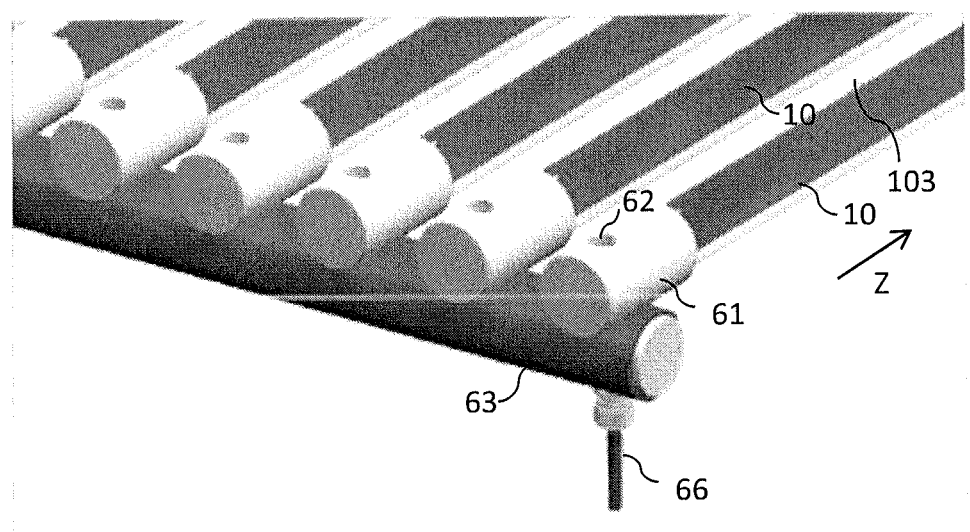

A further exemplary embodiment of a photovoltaic system described here is explained in more detail with reference to the diagrammatic depiction of FIG. 5. This shows an enlargement of an extract of the photovoltaic system shown in FIG. 4.

The holders 61 each have a screw hole 62 through which a screw 64 (not shown here) may be guided. By means of a screw 64, the holder 62 may be mechanically semi-releasably connected to the fixing tube 63. Furthermore, the photovoltaic system comprises a contact 66 which is freely accessible from the outside and serves for electrical contacting of the photovoltaic modules 10.

The holders 61 are mechanically connected to the photovoltaic modules 10. In the present case, two holders 61 are assigned to each photovoltaic module 10. It is furthermore possible, in contrast to the depiction in the figures, for only one or for more than two holders 61 to be assigned to each photovoltaic module 10. For example, the holders 61 are connected to the associated photovoltaic module 10 via a plug connection, a screw connection and/or a clamp connection. The connection and holding may for example take place in the same way as for a fluorescent tube.

Figure 6:
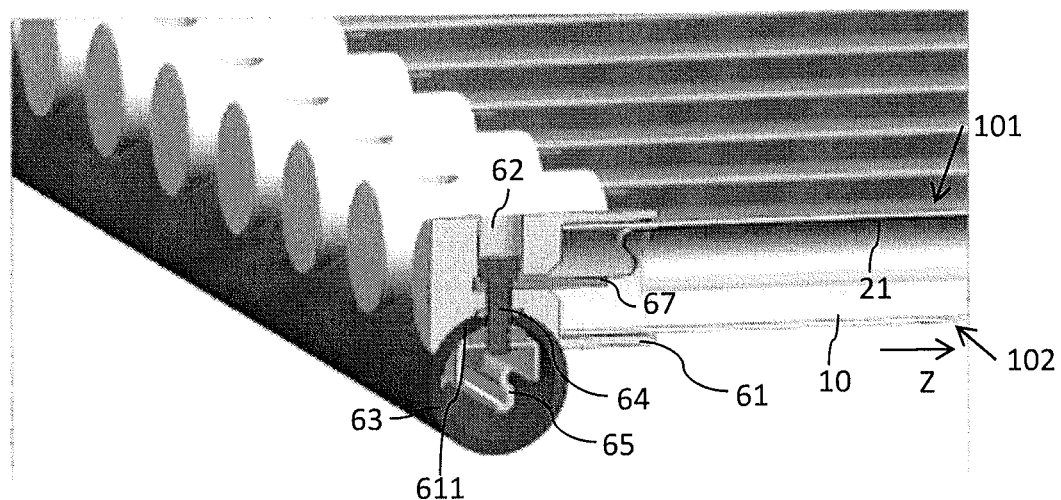

A further exemplary embodiment of a photovoltaic system described here is explained in more detail with reference to the diagrammatic depiction of FIG. 6. The photovoltaic system shown corresponds to that of FIGS. 4 and 5, wherein a cross-section through the photovoltaic module 10 and a fixing tube 63 in the main extension direction Z is shown. The holder 61 has cutouts 611 in the region of the fixing tube 63 to allow a flush termination of the holder 61 with the fixing tube 63.

The photovoltaic module 10 is mechanically semi-releasably connected to the fixing tube 63 via a screw 64 which is guided through the screw hole 62. For this mechanically semi-releasable connection, the fixing tube 63 has in its interior a fixing element 65 in which the screw 64 engages. The screw 64 is furthermore connected electrically conductively to a contact element 67, which in turn is connected electrically conductively to the solar cell arrangement 21 arranged on the top side 101 of the photovoltaic module 10 facing away from the fixing tube 63. The fixing element 65 thus serves for both mechanical connection of the holder 62 to the fixing tube 63, and also for electrical contacting of the solar cell arrangement 21 of the photovoltaic module 10.

Due to the mechanically semi-releasable connection of the holder 61 to the fixing tube 63, it is possible in particular to replace individual photovoltaic modules 10 with little cost. In this way, a low-maintenance photovoltaic system may be provided.

Figure 7:
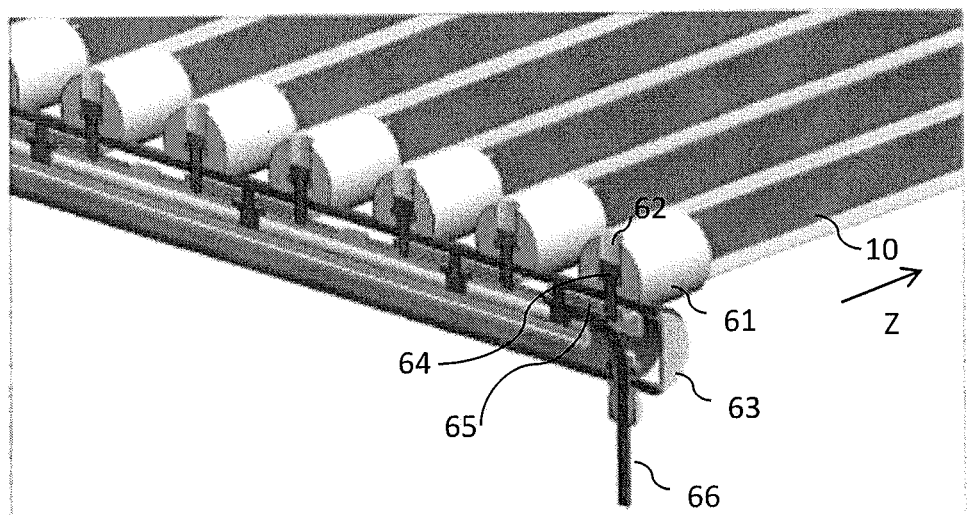

A further exemplary embodiment of a photovoltaic system described here is explained in more detail with reference to the diagrammatic depiction of FIG. 7. The photovoltaic system shown corresponds to that of FIGS. 4 to 6, wherein a cross-section through the fixing tube 63 and holders 61 perpendicular to the main extension direction Z is shown. The screws 64 engage in the fixing elements 65. These are in turn connected electrically conductively to the contact 66. The fixing elements 65 extend at least partially along the fixing tube 63. In the present case, two screws 64 are connected to each fixing element 65.

The invention is not restricted by the description to the exemplary embodiments described therein. Rather, the invention includes every new feature and every combination of features, which in particular includes every combination of features in the claims, even if this feature or this combination itself is not explicitly given in the claims or the exemplary embodiments.

This application claims priority of German application DE 10 2014 225 631.3, the content of which is hereby included by reference.

List of Reference Numerals:
Z Main extension direction
10 Photovoltaic module
101 Top side
102 Underside
103 Space
1 Tube
1a Inner face
1b Translucent face
1c Light-emergence face
1f Outer face
2 Photovoltaic component
21 Solar cell arrangement
22 Carrier film
231, 232 Encapsulation films
2c Base surface
3 Metal tube
31 Cooling chamber
4 Interior
61 Holder
611 Cutout
62 Screw hole
63 Fixing tube
64 Screw
65 Fixing element
66 Contact
67 Contact element
71 Light-emitting layers
72 Carrier layer
8 Accumulator
81 Electrical connections

The invention claimed is:

1. A photovoltaic module comprising:
a translucent tube surrounding an interior and having a main extension direction and a curved inner face facing the interior; and
a mechanically flexible photovoltaic component with a solar cell arrangement
wherein:
the photovoltaic component is arranged in the interior;
the solar cell arrangement has a curvature, wherein the curvature, at least in places, follows a curved course of the curved inner face of the translucent tube; and
the solar cell arrangement at least partially covers the curved inner face, wherein the covered curved inner face forms a light-passage surface of the photovoltaic module; and
wherein the photovoltaic component comprises at least two encapsulation films joined by substance bonding, wherein:
the solar cell arrangement is arranged completely between the at least two encapsulation films;
the at least two encapsulation films are thermoplastic films; and
the at least two encapsulation films are in direct contact with each other in a radially adjacent manner at least in places.

2. The photovoltaic module of claim 1, wherein at least one of the at least two encapsulation films covers the solar cell arrangement on an outer face thereof.

3. The photovoltaic module of claim 1, wherein in a cross-section perpendicular to the main extension direction, the solar cell arrangement has, at least in places, an arcuate form.

4. The photovoltaic module of claim 1, wherein at least 30% and up to 100% of the curved inner face of the translucent tube is covered by the solar cell arrangement.

5. The photovoltaic module of claim 1, wherein the light-passage surface is a single cohesive surface.

6. The photovoltaic module of claim 1, wherein the photovoltaic component perpendicular to the main extension direction is surrounded completely by the translucent tube.

7. The photovoltaic module of claim 1, wherein the solar cell arrangement is a copper indium gallium selenide (CIGS) solar cell arrangement or an organic solar cell arrangement.

8. The photovoltaic module of claim 1, wherein the solar cell arrangement has a maximum thickness of 5 µm.

9. The photovoltaic module of claim 1, wherein the photovoltaic component comprises a mechanically flexible light-emitting component, wherein:
the light-emitting component covers, at least in places, free areas of the curved inner face which are not covered by the solar cell arrangement;
the light-emitting component is electrically isolated from the solar cell arrangement; and
a curvature of the light-emitting component substantially follows the curved course of the curved inner face.

10. The photovoltaic module of claim 9, wherein an accumulator is arranged in the interior on a base surface of the photovoltaic component facing away from the curved inner face, wherein the accumulator is connected electrically conductively to the photovoltaic component.

11. The photovoltaic module of claim 10, wherein the accumulator is configured to store electrical energy generated by the solar cell arrangement and emit this to the light-emitting component after a time delay.

12. The photovoltaic module of claim 1, wherein a cylindrical metal tube is arranged in the interior on a base surface of the photovoltaic component.

13. The photovoltaic module of claim 12, wherein the cylindrical metal tube is in direct contact with the photovoltaic component at least in places and surrounds a cooling chamber filled with air or water.

14. A photovoltaic system comprising:
a plurality of photovoltaic modules according to claim 1;
a plurality of holders; and
at least two fixing tubes;

wherein each photovoltaic module is mechanically connected to at least one holder, and each holder is mechanically semi-releasably connected to at least one fixing tube.

15. The photovoltaic system according to claim 14, wherein the main extension directions of the plurality of photovoltaic modules run substantially parallel to each other.

16. The photovoltaic module of claim 1, wherein in a cross-section perpendicular to the main extension direction, the solar cell arrangement is present in less than a full circumferential region of the photovoltaic module.

17. The photovoltaic module of claim 1, wherein in at least partially covering the curved inner face, the solar cell arrangement covers less than a full circumference of the curved inner face.

18. The photovoltaic module of claim 1, wherein the solar cell arrangement is arranged between the at least two encapsulation films such that:

in a first region of the photovoltaic module, the solar cell arrangement physically intervenes between the at least two encapsulation films; and in a different second region of the photovoltaic module, the at least two encapsulation films abut one another without the solar cell arrangement physically intervening therebetween.

19. The photovoltaic module of claim 1, wherein the at least two encapsulation films comprise:

a first encapsulation film; and a second encapsulation film disposed concentrically inside the first encapsulation film, wherein the second encapsulation film includes a shoulder portion on which the solar cell arrangement at least partially rests in contact.

20. The photovoltaic module of claim 1, wherein the at least two encapsulation films comprise:

a first encapsulation film; and a second encapsulation film disposed concentrically inside the first encapsulation film, wherein the second encapsulation film includes a tab-like protrusion on which the solar cell arrangement at least partially rests in contact.

* * * * *